United States Patent
Gheewala

[19]

[11] Patent Number: 5,923,060
[45] Date of Patent: Jul. 13, 1999

[54] REDUCED AREA GATE ARRAY CELL DESIGN BASED ON SHIFTED PLACEMENT OF ALTERNATE ROWS OF CELLS

[75] Inventor: Tushar R. Gheewala, Los Altos, Calif.

[73] Assignee: In-Chip Systems, Inc., Sunnyvale, Calif.

[21] Appl. No.: 08/917,006

[22] Filed: Aug. 21, 1997

Related U.S. Application Data

[60] Provisional application No. 60/027,387, Sep. 27, 1996.
[51] Int. Cl.$^6$ .................................................. H01L 21/70
[52] U.S. Cl. ........................................ 257/207; 257/206
[58] Field of Search ...................................... 257/202–211

[56] References Cited

U.S. PATENT DOCUMENTS

| | | | |
|---|---|---|---|
| 4,745,084 | 5/1988 | Rowson et al. | 257/208 |
| 4,928,160 | 5/1990 | Crafts | 257/206 |
| 5,384,472 | 1/1995 | Yin | 257/206 |
| 5,701,021 | 12/1997 | Yin | 257/206 |

FOREIGN PATENT DOCUMENTS

| | | | |
|---|---|---|---|
| 60-021542 | 2/1985 | Japan | 257/206 |
| 60-130138 | 7/1985 | Japan | 257/206 |
| 5-151870 | 5/1992 | Japan | 257/206 |

*Primary Examiner*—David B. Hardy
*Attorney, Agent, or Firm*—Townsend & Townsend & Crew LLP; Kenneth R. Allen; Gregory S. Bishop

[57] ABSTRACT

A gate array basic cell and circuit layout architecture for efficiently routing power supply traces. A basic cell has one or more transistors PMOS and one or more NMOS formed by diffusion regions and gate regions. A portion of the diffusion region extends outward to a point past the end of the gate region. Basic cells are arranged in rows with each basic cell having its p-type diffusion region extending in a direction opposite the n-type diffusion region. Basic cells are arranged in rows. Power supply traces are placed between rows, across the extended diffusion regions. Adjacent rows are shifted with respect to each other. A power supply trace is shared by adjacent rows of basic cells such that a connection can be made between the power supply trace and the extended diffusion regions without additional routing.

18 Claims, 9 Drawing Sheets

REDUCED AREA GATE ARRAY CELL DESIGN BASED ON SHIFTED PLACEMENT OF ALTERNATE ROWS OF CELLS

This application claims the benefit of Provisional Application Ser. No. 60/027,387, filed Sept. 27, 1996, incorporated herein by reference.

BACKGROUND OF THE INVENTION

The present invention relates in general to cell-based integrated circuits such as gate arrays, and in particular, to an improved layout of basic cells to reduce the area needed for a particular design.

Gate array technology, also known as standard cell design, has been developed for quickly designing integrated circuits. Gate array technology is characterized by predesigned circuit units known as "macro cells." Macro cells are commonly used elements such as NAND gates, NOR gates, and flip-flops, etc. A designer may select a desired macro cell from a library of macro cells and place it in a design. The macro cells may be interconnected in a variety of ways to create a desired functionality for the integrated circuit. By being able to select the macro cells from a library and to place them into a design, a designer can quickly design a function without having to worry about the details of each individual transistor.

A macro cell is made up of interconnected basic cells. A basic cell is the smallest building block of the technology, and generally consists of one or more transistors. The basic cells are efficiently arranged as an array on the integrated circuit. A library of macro cells is designed from basic cells for a certain technology, and their design characteristics typically do not change from one design to the next.

Because a designer will use many macro cells in a particular design, it is important that the macro cells be designed as efficiently as possible. As described above, the macro cells are made up of interconnected basic cells. Therefore, it is important that the basic cells be designed such that they can be interconnected efficiently (local interconnections) and that the macro cells are interconnected efficiently to other macro cells and to I/O and power supply signals (global interconnections.)

One concern of a macro cell designer is to be able to route VDD and GROUND power supply traces to the transistors on the basic cells efficiently. FIG. 1 illustrates a prior art basic cell design and an integrated circuit architecture used, for example, in U.S. Pat. Nos. 5,072,285, 4,682,201, 4,884,118, 4,783,692, and others, to route power supply traces to the basic cells.

In FIG. 1, a planer representation of two basic cells 101 is illustrated. Basic cell 101 consists of two gate electrode regions 105 and 106 extending across a p-type diffusion region 110 forming a pair of PMOS transistors, and two gate electrode regions 115 and 116 extending across an n-type diffusion region 120 forming a pair of NMOS transistors. Several basic cells 101 are arranged on the substrate in rows. Power supply traces 130 and 132 are on a first level metalization layer above diffusion region 105 and extend across respective rows of the basic cells 101. Typically, power supply trace 130 serves as VDD and power supply trace 132 serves as GROUND. Most commonly, power supply traces 130 and 132 are connected to diffusion regions 110 and 120 at a common node between the two transistors.

An advantage of this architectural layout is that a direct connection can be made between power supply traces 130 and 132 and diffusion region 110 and 120 respectively, without additional metal routing. A disadvantage of this architectural layout is that power supply traces 130 and 132 block vertical connections on the first layer metalization. Routing local interconnections between nodes of a basic cell to create macro cells is necessary. With power supply traces 130 and 132 extending across the middle of each row, many vertical local interconnections are blocked on the first level of metal. This requires an increased use of a second metalization layer to allow signals to cross over power supply traces 130 in the vertical direction.

FIG. 2 represents another layout style using a modified basic cell 201 and power supply trace arrangement. It is described, for example, in U.S. Pat. No. 4,884,115, U.S. Pat. No. 5,493,135. In this layout style, basic cells 201 are arranged into rows. Modified basic cell 201 may be identical to basic cell 101 of FIG. 1, or it may be a modified design as depicted in FIG. 2. Power supply traces 211 and 212 are placed outside each row of basic cells 101. Typically, power supply trace 211 serves as VDD, and power supply trace 212 serves as GROUND. A metal connection trace 218 is placed between power supply trace 211 and p-type diffusion region 220. Typically, metal connection trace 218 is formed in the first level metalization. Similar metal traces (not shown) are used to connect power supply trace 212 with the n-type diffusion region 230.

By this arrangement, vertical routing among basic cells is not blocked on the first level metalization. However, horizontal routing is still blocked due to metal connection trace 218. In several prior art references, including U.S. Pat. No. 5,493,135, modified basic cell 201 with a diffusion extension 225 is introduced. Diffusion extension 225 reduces the necessary length of metal connection trace 218. However, some blockage of horizontal traces still occurs.

A further advantage of the style of architecture shown in FIG. 2 is depicted in FIG. 3. Adjacent rows of basic cells are inverted with respect to each other so that a single power supply trace can be shared between two rows of basic cells. For example, power supply traces 310 and 315 may serve as VDD while power supply trace 320 may serve as GROUND. By stacking inverted rows in this way, the space required for one power supply trace is saved in each row.

Even with the improvements described above, the existing architectures for design of gate arrays are still not completely efficient. As mentioned above, the architecture shown in FIG. 1 blocks vertical routing, and the architectures shown in FIGS. 2 and 3 block some horizontal routing and do not allow a direct connection between the power supply traces and the diffusion layer. A basic cell and circuit architecture that does not have these limitations is desirable.

SUMMARY OF THE INVENTION

A basic cell for use in an integrated circuit is described. The basic cell comprises a diffusion region having a planer shape including a main diffusion region and an extended diffusion region, wherein the extended diffusion region extends outwardly from the main diffusion region. One or more gate regions extend across the main diffusion region to form one or more transistors. The extended diffusion region extends outwardly past the end of the gate region or regions to allow a power signal trace to be placed outside the main diffusion region while still providing a direct contact between the diffusion region and the power signal trace. This leaves the area between the power supply traces free for internal routing on the first metalization level.

An integrated circuit architecture is also provided wherein adjacent rows of basic cells are offset with respect to each other, allowing alternating rows to share a single power supply trace while still allowing a direct contact between the power supply trace and the diffusion region of the individual basic cells.

Further features of the invention, its nature and various advantages will be more apparent from the accompanying drawings and the following detailed description of the specific embodiments.

DESCRIPTION OF SPECIFIC EMBODIMENTS

Figure 4:
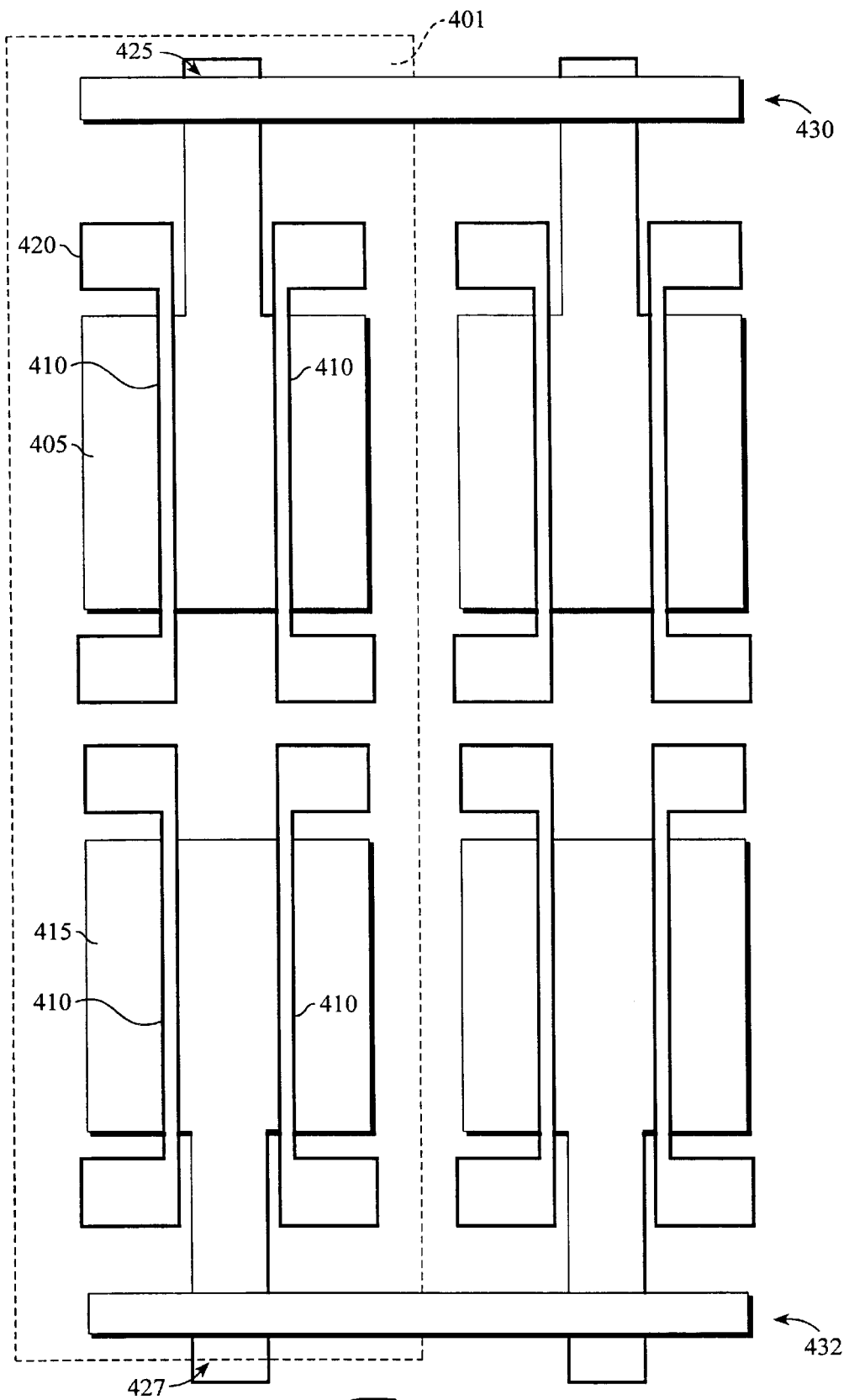
FIG. 4 illustrates a basic cell architecture of the present invention.

FIG. 4 illustrates a specific embodiment of a basic cell 401 constructed according to the principles of the present invention. It will be evident to those skilled in this art that other basic cells may also be implemented without departing from the spirit and scope of the invention. Basic cell 401 comprises a p-type diffusion region 405 and an n-type diffusion region 415. The p-type diffusion region 405 is divided by two gate regions 410 creating two PMOS transistors, and the n-type diffusion region 415 is divided by two gate regions 410 creating two NMOS transistors.

Gate regions 410 preferably have at least one contact area 420. Contact area 420 is an area of gate region 410 sufficiently large to allow connection of routing traces. The size of contact area 420 is determined by the predetermined design rules of the technology being used. In the specific embodiment, each end of gate region 410 has a contact area 420.

A p-type extended diffusion region 425 extends outwardly from p-type diffusion region 405, and an n-type extended diffusion region 427 extends outwardly from n-type diffusion regions 415. Extended diffusion regions 425 and 427 extend to a point past the end of gate region 410. In the specific embodiment, extended diffusion regions 425 and 427 connect to diffusion regions 405 and 415 at a position between the two gate regions 410. Extended diffusion regions 425 and 427 extend from main diffusion regions 405 and 415 in opposite directions away from basic cell 401.

A plurality of basic cells 401 is placed in rows across the substrate of the integrated circuit. In adjacent rows, basic cells 401 are inverted with respect to each other so that the PMOS transistors of adjacent rows are together and the NMOS transistors of adjacent rows are together.

Power supply traces 430 and 432 are preferably placed on the outer edges of each row of the array. They extend across extended diffusion regions 425 and 427. This arrangement allows power supply traces 430 and 432 to be directly connected to extended diffusion regions 425 and 427 without extra metal traces. Power supply traces 430 and 432 are conductive bus regions coupled to the power supply source for the integrated circuit. However, other arrangements may be used advantageously, such as multiple direct traces. Typically, they will be formed with first level metalization, although other conductive levels may be used. In the specific embodiment, power supply trace 430 serves VDD and power supply trace 432 serves as GROUND.

While a specific embodiment of the present invention is depicted in FIG. 4, it can be readily envisioned that similar structures could be used without departing from the spirit and scope of the present invention. For example, a basic cell may have only one PMOS transistor and one NMOS transistor, rather than the two pairs of transistors shown, or each basic cell may have more than a pair of each type of transistor. The transistors may also be arranged differently on diffusion regions 405 and 415. Alternatively, each gate region 410 may have only one contact region 420, instead of two, as shown in FIG. 4. Diffusion regions 405 and 415 need not be rectangular, nor must the extended diffusion regions 425 and 427 be rectangular.

Figure 1:
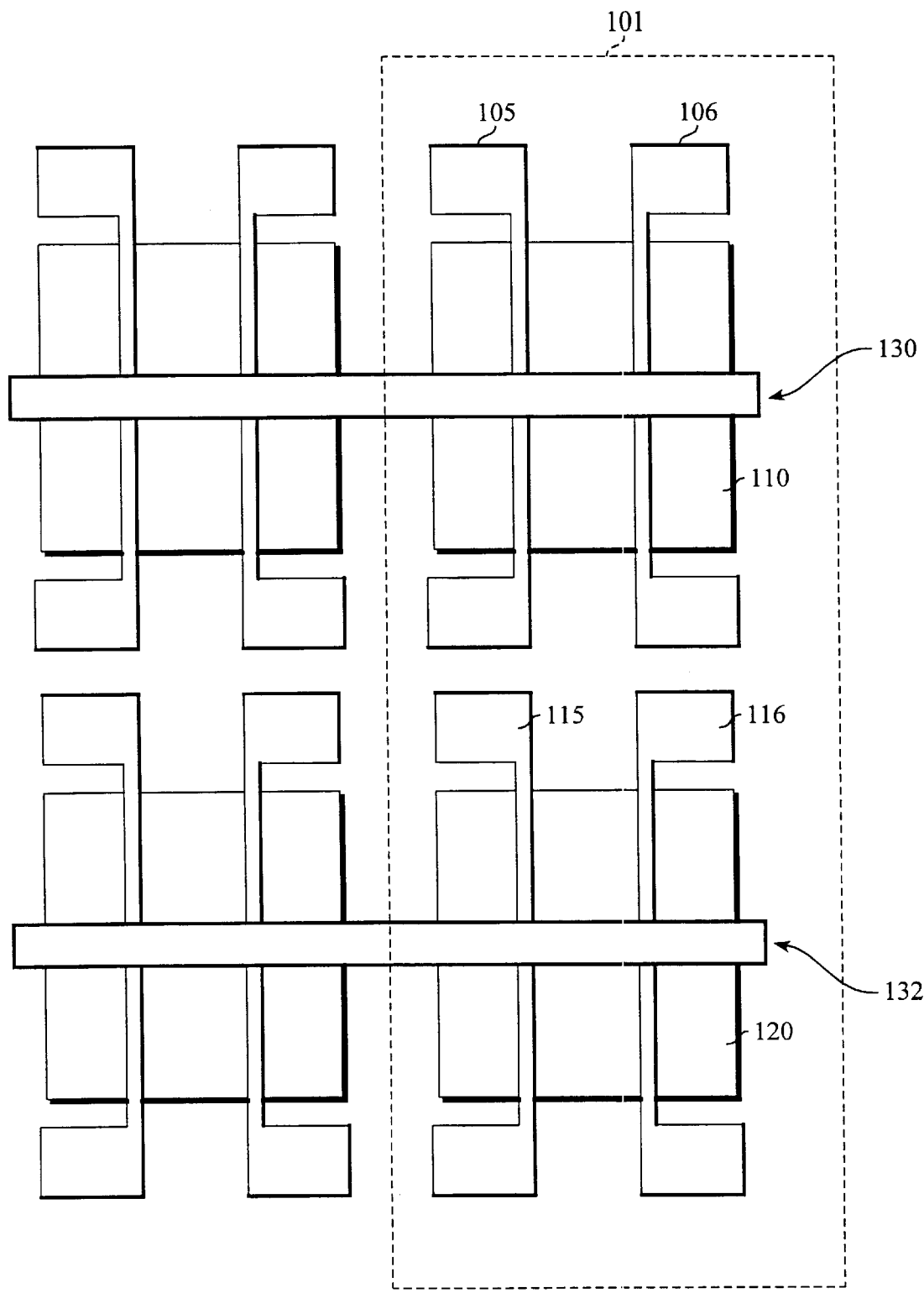
FIG. 1 is a diagram of a prior art basic cell architecture.
Figure 2:
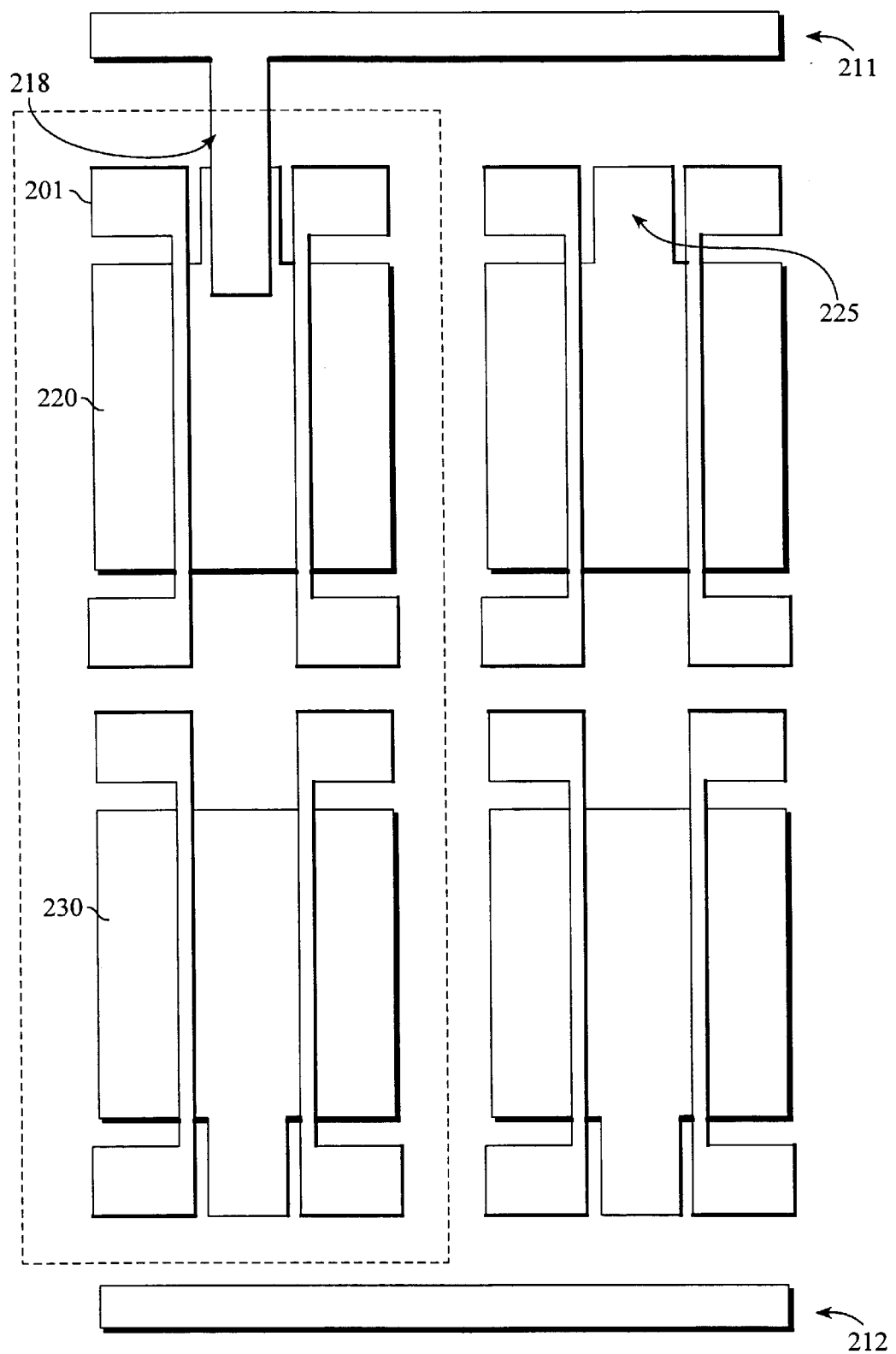
FIG. 2 is a diagram of a second type of prior art basic cell architecture.
Figure 3:
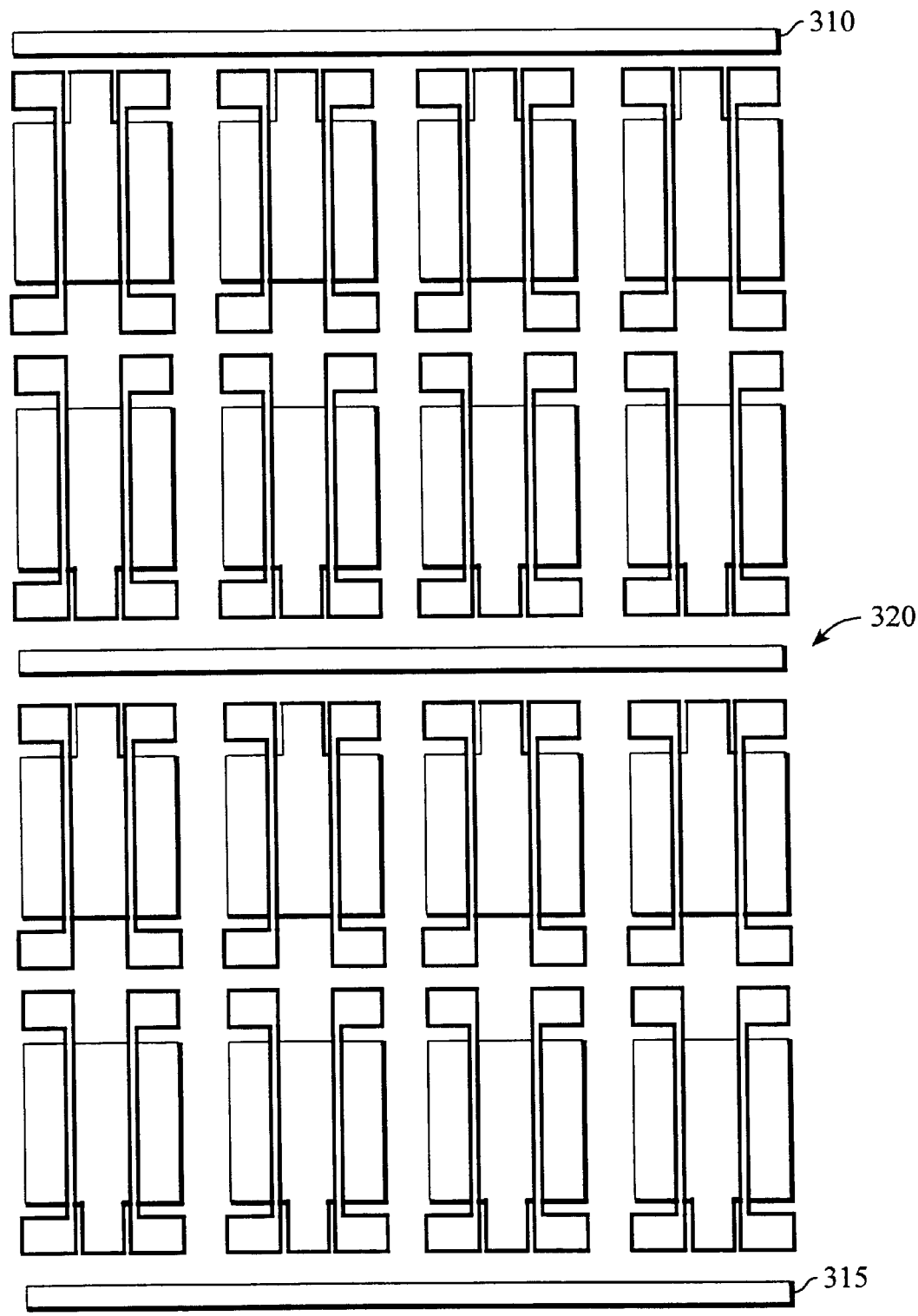
FIG. 3 is diagram depicting a further improvement on the architecture of FIG. 2, wherein adjacent rows of basic cells share a power supply trace.
Figure 5:
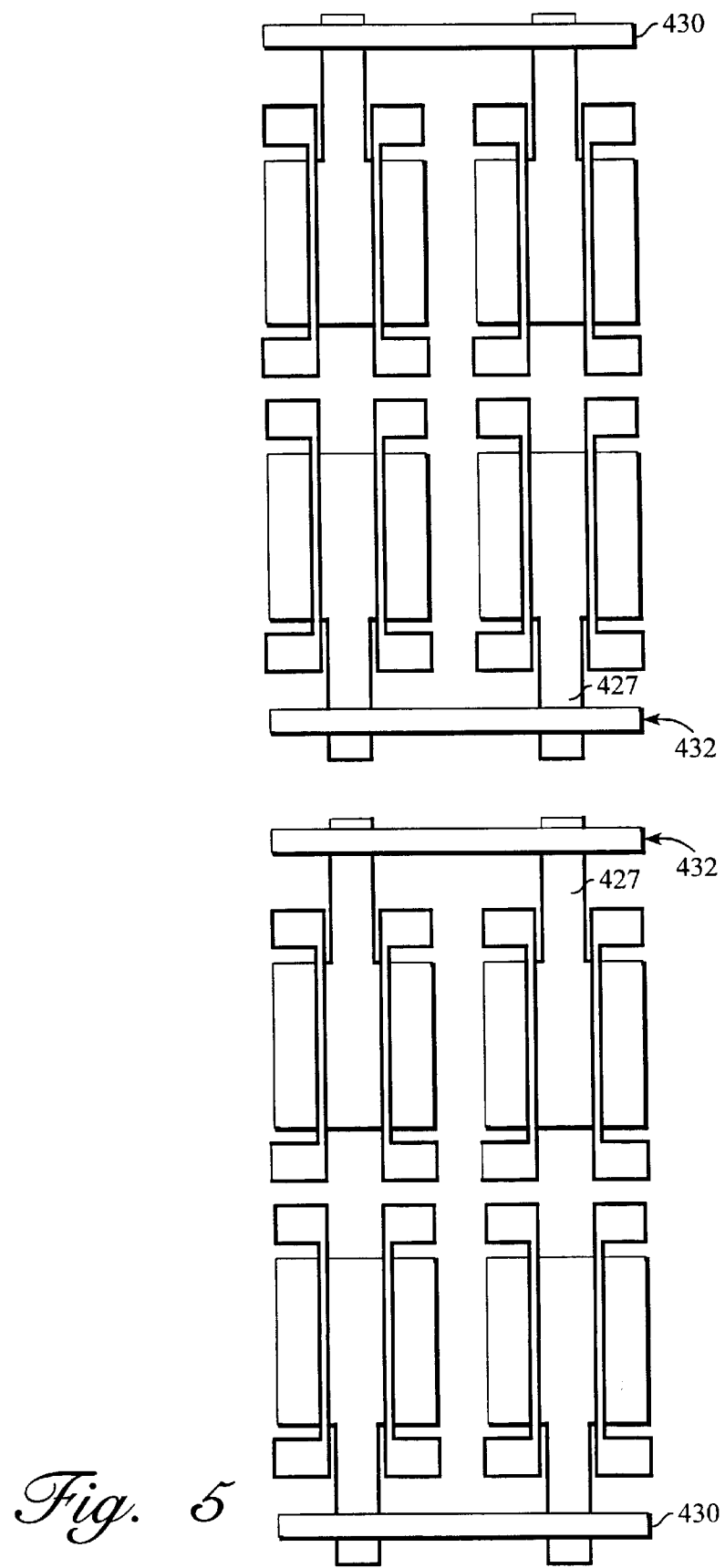
FIG. 5 illustrates a limitation of placing adjacent basic architectural elements together.

Applying the advantages of the basic cell shown in FIG. 4 with the improvement shown in FIG. 3 is desirable. However, as shown in FIG. 5, adjacent rows of basic cells 401 cannot be inverted and share a common power supply trace 432 in the traditional manner shown in FIG. 3. Such a placement would cause the extended diffusion region 427 to occupy the same area and form a short-circuit between adjacent basic cells 401.

Figure 6:
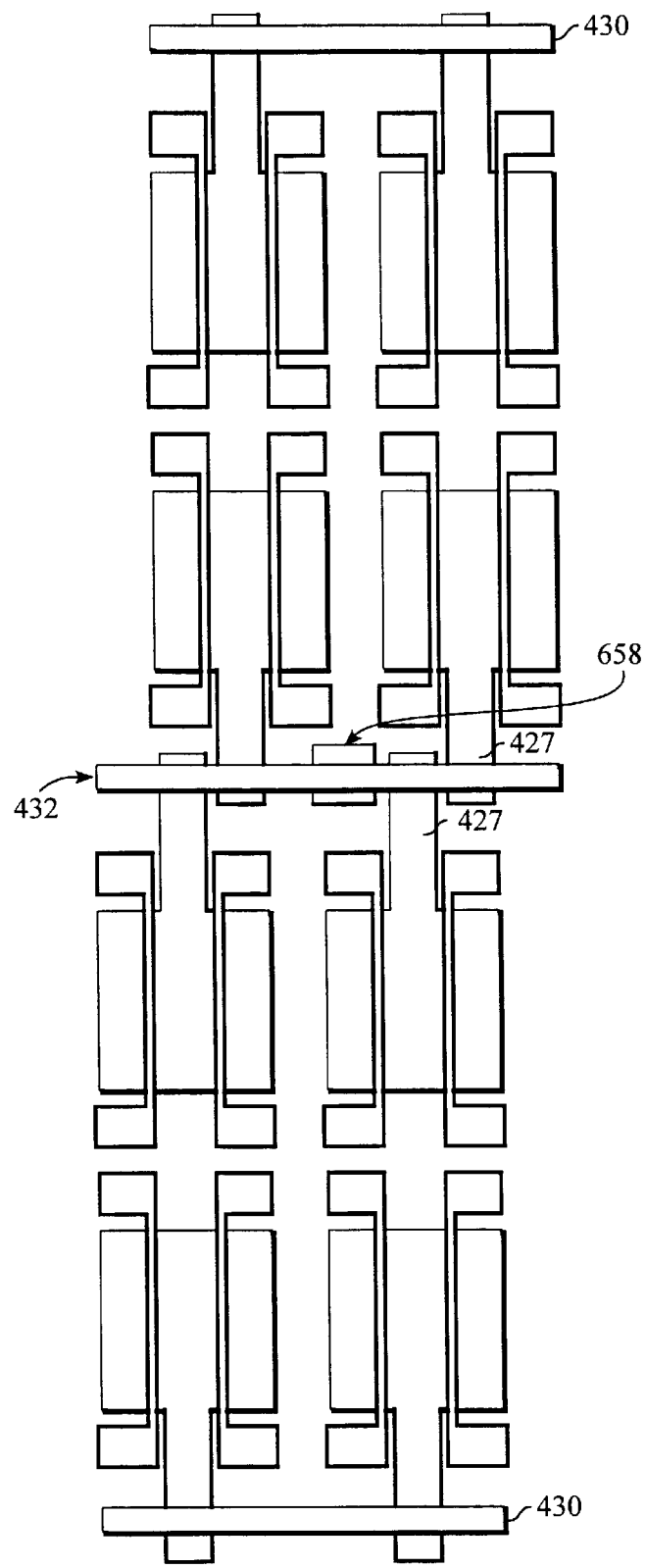
FIG. 6 illustrates an improved layout with alternating rows shifted to allow the reduction of a power supply trace.

FIG. 6 shows a novel placement method according to another aspect of the present invention. Adjacent rows of basic cells 401 are inverted and laterally offset with respect to each other. The offset is of a sufficient amount that extended diffusion region 427 of one row of basic cells does not overlap with extended diffusion region 427 of the other row of basic cells. Adjacent rows can then be brought together to share a common power supply trace 432 without having an overlap of extended diffusion regions 427. The same principle can be used to share power supply trace 430 between the next row of basic cells 401. With alternating rows of basic cells 401 shifted in this fashion, each additional row may save the area needed for a power supply trace.

Additional benefit may be gained by placing a substrate contact 658 along power supply trace 432 between adjacent extended diffusion regions 427. Substrate biasing techniques often require a connection between a power supply trace and the substrate of an integrated circuit. By placing substrate contact 658 as shown in FIG. 6, the contact may be made without additional routing traces.

The new basic cell 401 described in FIG. 4 and the new layout architecture described in FIG. 6 provide the benefits of the two prior art layouts described above, without the prior art's associated shortcomings. For example, a direct contact can be made between the power supply traces and the diffusion region; the power supply traces are placed outside of the basic cell region, reducing vertical routing blockage; and, power supply traces can be shared between adjacent cells. Other advantages may also be apparent to one of skill in the art.

Figure 7:
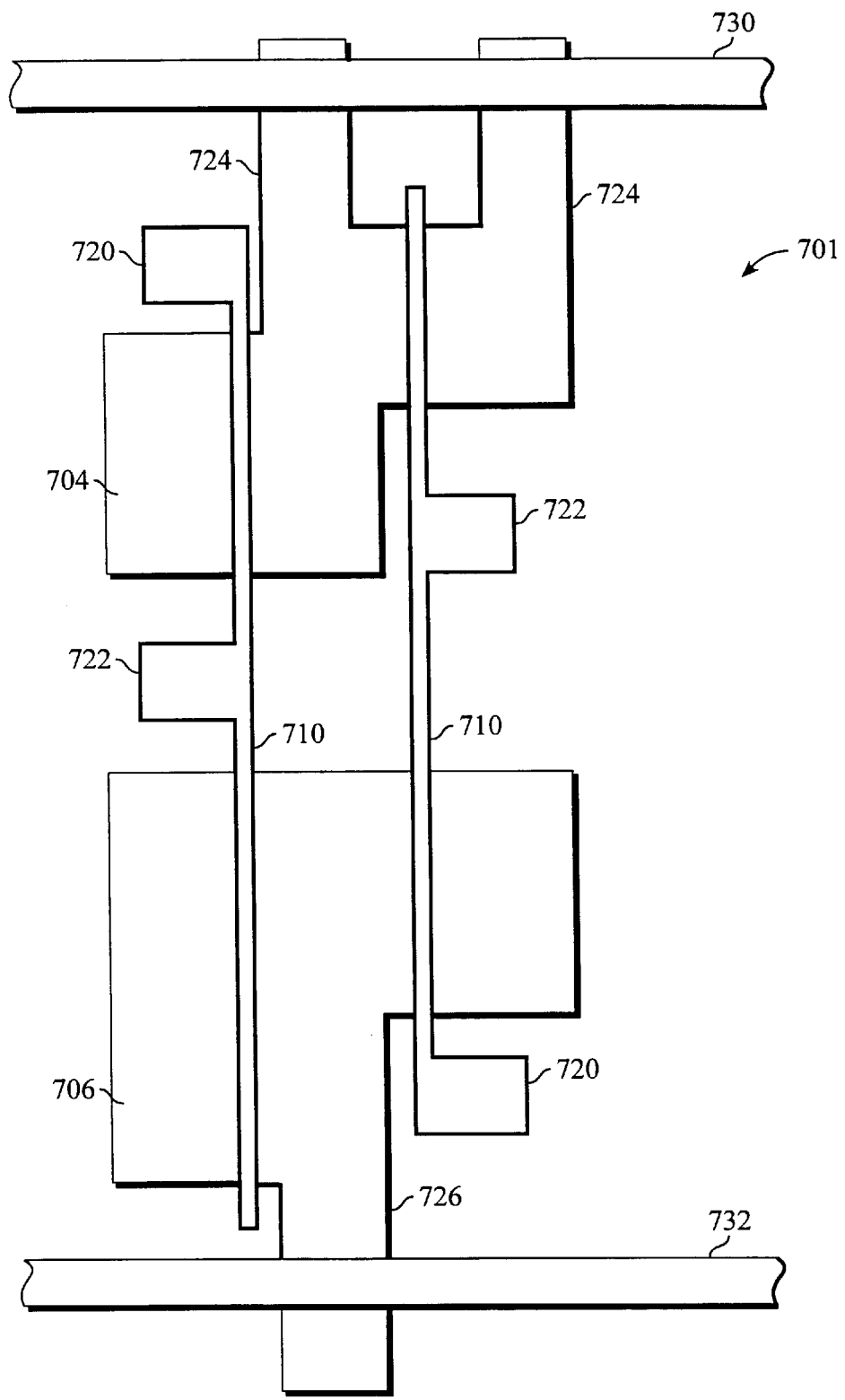
FIG. 7 is a diagram of another embodiment of a basic cell of the present invention.

FIG. 7 shows another specific embodiment of a basic cell 701 that may be used in accordance with the principles of the present invention. Basic cell 701 is similar to a basic cell described in U.S. patent application Ser. No. 08/557,474, filed Nov. 14, 1995, by the present inventor. Basic cell 701 has a p-type diffusion region 704 and an n-type diffusion region 706 arranged adjacently to each other. Two gate regions 710 extend across each of p-type diffusion region 704 and n-type diffusion region 706 such that each gate region 710 creates a PMOS transistor and an NMOS transistor. The gate regions 710 have expanded areas at one end forming gate contacts 720. The gate regions 710 also have expanded areas at an intermediate point between diffusion regions 704 and 706 forming gate contacts 722. Gate contacts 720 and 722 are provided for allowing local and global interconnections to electrically connect to gate region 710.

P-type diffusion region 704 and n-type diffusion region 705 are preferably shaped to meet design rule specifications while not using more space than is necessary. In this specific embodiment, p-type diffusion region 704 has two p-type extended diffusion regions 724 extending away from p-type diffusion region 704 in a direction away from n-type diffusion region 706. N-type diffusion region 706 has a similar n-type extended diffusion region 726 extending in the opposite direction. Two p-type extended diffusion regions 724 and one n-type extended diffusion region 726 are provided in basic cell 701, although any number may be implemented without departing from the spirit and scope of the invention.

Power supply traces 730 and 732 extend across p-type extended diffusion region 724 and n-type extended diffusion region 726 respectively. As in the previous embodiment, this placement allows a direct contact between power supply traces 730 and 732 and the p-type and n-type diffusion regions respectively, without additional metalization traces. Preferably, power supply trace 730 is coupled to VDD and power supply trace 732 is coupled to GROUND.

Figure 8:
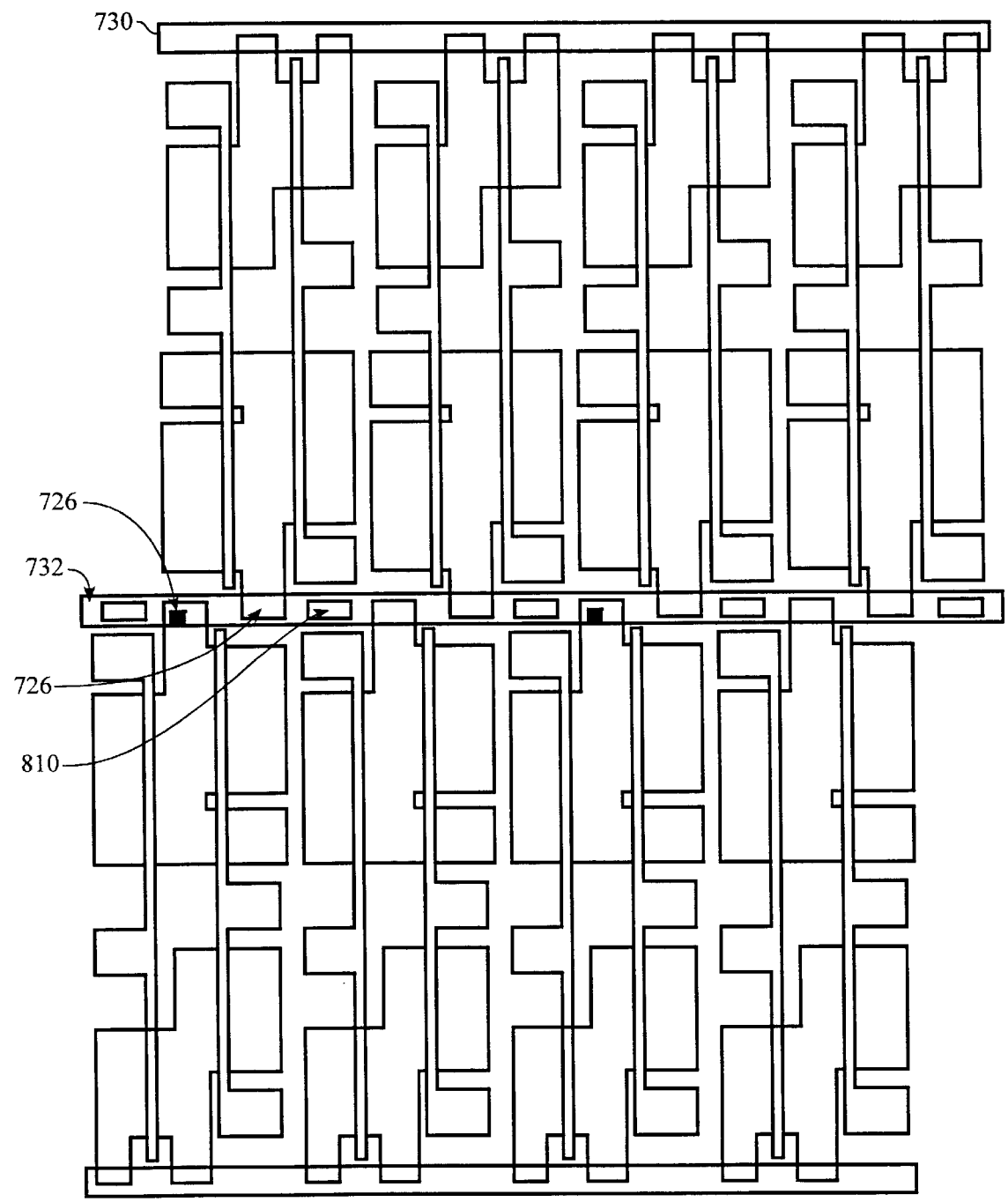
FIG. 8 is a diagram of an integrated circuit architecture using the basic cell of FIG. 7.

FIG. 8 illustrates a circuit layout architecture utilizing basic cell 701. A first row of basic cells 701 are placed adjacent a second row of basic cells 701 with the second row inverted with respect to the first row. Power supply trace 732 extends across n-type extended diffusion regions 726 of each basic cell 701 between the first and second rows of basic cells 701. However, since this would cause adjacent cells to have contact between the basic cells 701, one row is shifted with respect to the other. This placement allows two rows of basic cells 701 to share a single power supply trace 732.

Placement of a substrate contact 810 connecting power supply trace 732 with the substrate at a point where power supply trace 732 crosses an open area of the substrate also saves area and reduces routing. Specifically, this placement allows a direct contact between the substrate and the power supply trace without any additional routing. An appropriate placement of substrate contact 810 is shown in FIG. 8.

Figure 9:
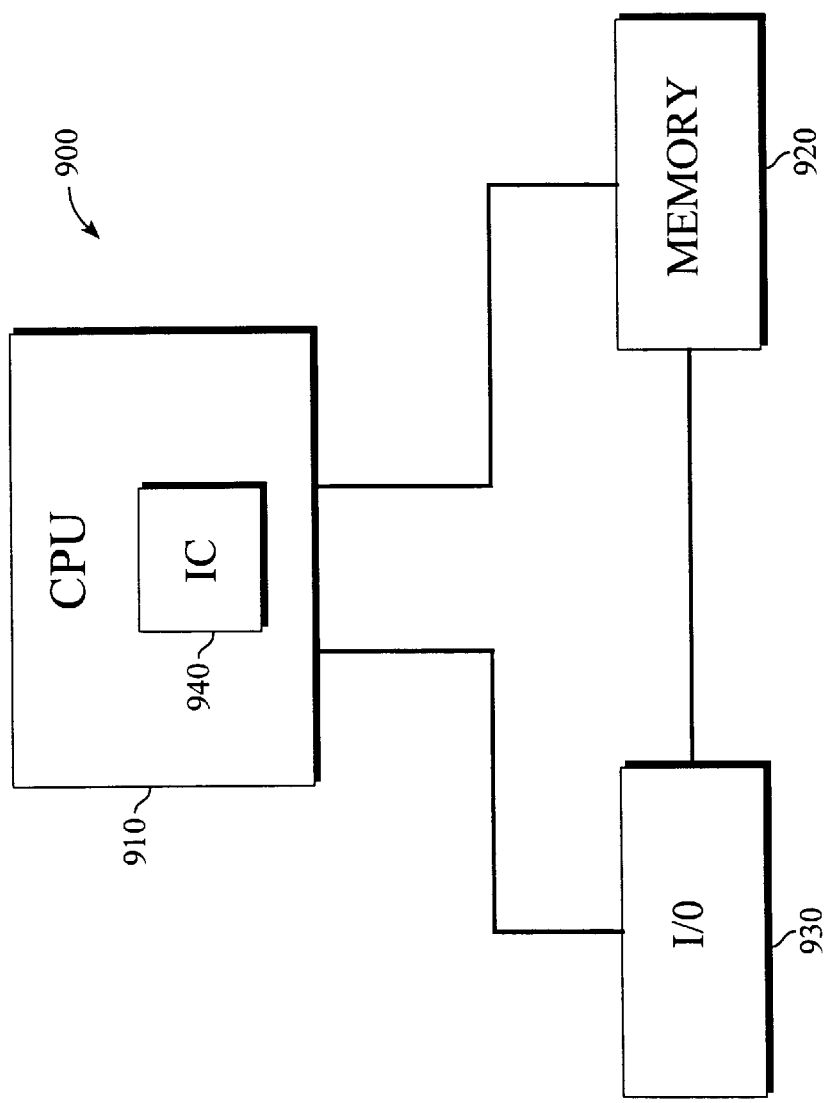
FIG. 9 illustrates a digital system incorporating an integrated circuit of the present invention.

FIG. 9 illustrates a typical environment in which the present invention may be embodied. A digital system 900 has a processing unit (CPU) 910 which is coupled with a memory 920 and an input/output device 930. A personal computer is one example of such a digital system. However, a wide variety of electronics and consumer products will find beneficial use from the present invention. For example, the present invention will be useful in digital systems in the areas of telecommunications, switches, networking systems, and many other applications.

Processing unit 910 contains one or more integrated circuits 940 of the type described in the present invention. In other embodiments of this invention, one or more integrated circuits 940 are contained within input/output device 930 or memory 920.

The digital system of FIG. 9 may be embodied on a single chip, a single board, on multiple boards, or even within multiple enclosures. Furthermore, the system may have any multiple or combination of the elements shown. For example, a digital system may have multiple processing units 910, or no processing unit 910 at all. One of skill in the art can readily see many applications for utilizing such a device within a variety of digital systems.

Although specific embodiments of the present invention have been described herein, variations of this design that do not depart from the spirit and scope of the claims presented herein are also conceivable. For example, n-type and p-type regions may be interchanged, n-type extended diffusion region 724 may be designed such that it can share power supply trace 730 with an adjacent line of basic cells, or changes made to the configuration of the basic cell such that the offset is built into a single basic cell. Furthermore, more transistors, more extended diffusion regions, or more gate contacts may be added if it is advantageous for an application. The present invention is intended to be limited only by the attached claims.

What is claimed is:

1. A basic cell for use in rows of an integrated circuit, comprising:

a diffusion region including a main diffusion region and an extended diffusion region, the extended diffusion region extending out from the main diffusion region in a first direction;

a first gate region extending across the main diffusion region in the first direction, the first gate region forming a transistor gate terminal with transistor source and drain terminals on opposite sides of the first gate region; and a first extended gate region at a first end of the first gate region, wherein the extended diffusion region extends outwardly in the first direction past the first extended gate region.

2. The basic cell of claim 1 wherein the main diffusion region and the extended diffusion region are rectangular in shape, with the extended diffusion region extending outwardly approximately from a midpoint of one side of the main diffusion region.

3. The basic cell of claim 1 further comprising a second extended gate region at a second end of the first gate region.

4. The basic cell of claim 1 further comprising:

a second gate region extending across the main diffusion region, and a second extended gate region at a first end of the second gate region, the first and second gate regions being located on opposite sides of the extended diffusion region, wherein the extended diffusion region extends outwardly from the main diffusion region in the first direction past the first and second extended gate regions.

5. A circuit layout architecture comprising:

a plurality of basic cells as recited in claim 1 arranged in rows;

a conductive trace extending across at least one of the extended diffusion regions of a row of basic cells; and a contact region coupling the conductive trace to at least one of the extended diffusion regions of the row of basic cells.

6. The basic cell of claim 1 wherein the first extended gate region is a contact region for coupling routing traces to the gate region.

7. A basic cell for use in rows of an integrated circuit comprising:

first and second diffusion regions, each diffusion region including a main diffusion region and an extended diffusion region, the extended diffusion region extending out from the main diffusion region in a first direction;

a gate region extending across the main diffusion region in the first direction, the gate region creating a transistor gate terminal with transistor source and drain terminals on opposite sides of the gate region; and wherein the extended diffusion region extends outwardly in the first direction past the end of the gate region and the gate region extends across both the main diffusion region of the first diffusion region and the main diffusion region of the second diffusion region, wherein the extended diffusion regions of the first diffusion region extends outwardly from the basic cell in the first direction and the extended diffusion region of the second diffusion region extends outwardly from the main diffusion region in a direction opposite the first direction.

8. The basic cell of claim 7 wherein the first diffusion region is an n-type material and the second diffusion region is a p-type material.

9. A basic cell for use in an integrated circuit using macro cells comprising:

a p-type diffusion region with a extended portion of the p-type diffusion region extending outwardly from the p-type diffusion region in a first direction;

an n-type diffusion region with a extended portion of the n-type diffusion region extending outwardly from the n-type diffusion region in a second direction opposite the first direction; and first and second gate regions extending across the p-type diffusion region and the n-type diffusion region forming PMOS transistors and NMOS transistors, wherein a first end of the first gate region and a first end of the second gate region do not extend outwardly in the first direction as far as the extended portion of the p-type diffusion region, and a second end of the first gate region and a second end of the second gate region do not extend outwardly in the second direction as far as the extended portion of the n-type diffusion region.

10. A basic cell for arrangement in rows for use in an integrated circuit using cells comprising:

a p-type active diffusion region having a non-rectangular outline;

an n-type active diffusion region having a non-rectangular outline;

a first gate electrode extending across said p-type and n-type active diffusion regions in a first direction separating source contact regions and drain contact regions of a first PMOS transistor and separating source contact regions and drain contact regions of a first NMOS transistor, respectively;

a second gate electrode extending across said p-type and n-type active diffusion regions in said first direction separating source contact regions and drain contact regions of a second PMOS transistor and separating source contact regions and drain contact regions of a second NMOS transistor, respectively, said first gate electrode having a first end and a opposing second end, said first end having a contact region laterally adjacent said p-type active diffusion region, said second end having no contact region, said first gate electrode having contact at an intermediate contact region, and said second gate electrode having a third end and an opposing fourth end, said third end having a contact region laterally adjacent said n-type active diffusion region, said fourth end having no contact region, said second gate electrode having contact at an intermediate contact region;

wherein a portion of the n-type active diffusion region extends past the first end of the first gate electrode and the third end of the second gate electrode; and wherein a portion of the p-type active diffusion region extends past the second end of the first gate electrode and the fourth end of the second gate electrode.

11. A circuit layout architecture for an integrated circuit using cells, comprising:

a first conductive trace;

a second conductive trace;

a row of basic cells, each basic cell comprising:

a p-type diffusion region with a extended portion of the p-type diffusion region extending outwardly from the p-type diffusion region in a first direction;

an n-type diffusion region with a extended portion of the n-type diffusion region extending outwardly from the n-type diffusion region in a second direction opposite the first direction; and a gate regions extending across the p-type diffusion region and the n-type diffusion region forming a PMOS transistors and an NMOS transistors, wherein a first end of the first gate region and a first end of the second gate region do not extend outwardly in the first direction as far as the extended portion of the p-type diffusion region, and a second end of the first gate region and a second end of the second gate region do not extend outwardly in the second direction as far as the extended portion of the n-type diffusion region;

wherein the first conductive trace crosses the extended diffusion region of the p-type diffusion region of each of the basic cells in the row and the second conductive trace crosses the extended diffusion region of the n-type diffusion region in the row.

12. A circuit layout architecture for an integrated circuit using cells comprising:

first and second rows of basic cells, each of the basic cells comprising:

a first conductive trace;

a second conductive trace;

a row of basic cells, each basic cell comprising:

a p-type diffusion region with a extended portion of the p-type diffusion region extending outwardly from the p-type diffusion region in a first direction;

an n-type diffusion region with a extended portion of the n-type diffusion region extending outwardly from the n-type diffusion region in a second direction opposite the first direction; and a gate regions extending across the p-type diffusion region and the n-type diffusion region forming a PMOS transistors and an NMOS transistors, wherein a first end of the first gate region and first end of the second gate region do not extend outwardly in the first direction as far as the extended portion of the p-type diffusion region, and a second end of the first gate region and a second end of the second gate region do not extend outwardly in the second direction as far as the extended portion of the n-type diffusion region;

wherein the first conductive trace crosses the extended diffusion region of the p-type diffusion region of each of the basic cells in the row and the second conductive trace crosses the extended diffusion region of the n-type diffusion region in the row; and wherein the second row of basic cells is inverted and laterally offset with respect to the first row of basic cells and the second conductive trace crosses the extended diffusion region of the n-type diffusion of the first row basic cells and the extended diffusion region of the n-type diffusion region of the second row of basic cells.

13. A circuit layout architecture for an integrated circuit using cells comprising:

first and second rows of basic cells, each of the basic cells comprising:
   a first conductive trace;
   a second conductive trace;
   a row of basic cells, each basic cell comprising:
      a p-type diffusion region with a extended portion of the p-type diffusion region extending outwardly from the p-type diffusion region in a first direction;
      an n-type diffusion region with a extended portion of the n-type diffusion region extending outwardly from the n-type diffusion region in a second direction opposite the first direction; and
      a gate regions extending across the p-type diffusion region and the n-type diffusion region forming A PMOS transistors and an NMOS transistors, wherein a first end of the first gate region and a first end of the second gate region do not extend outwardly in the first direction as far as the extended portion of the p-type diffusion region, and a second end of the first gate region and a second end of the second gate region do not extend outwardly in the second direction as far as the extended portion of the n-type diffusion region;
   wherein the first condictive trace crosses the extended diffusion region of the p-type diffusion region of each of the basic cells in the row and the second conductive trace crosses the extended diffusion region of the n-type diffusion region in the row; and
   wherein the second row of basic cells is inverted and laterally offset with respect to the first row of basic cells and the second conductive trace crosses the extended diffusion region of the p-type diffusion of the first row basic cells and the extended diffusion region of the p-type diffusion region of the second row of basic cells.

14. A circuit layout architecture for an integrated circuit using cells comprising:

a first conductive trace;
a second conductive trace;
a substrate contact, the substrate contact coupling a substrate of the integrated circuit with at least one of the first conductive trace and the second conductive traces;
a row of basic cells, each basic cell comprising:
   a p-type diffusion region with a extended portion of the p-type diffusion region extending outwardly from the p-type diffusion region in a first direction;
   an n-type diffusion region with a extended portion of the n-type diffusion region extending outwardly from the n-type diffusion region in a second direction opposite the first direction; and
   a gate regions extending across the p-type diffusion region and the n-type diffusion region forming a PMOS transistors and an NMOS transistors, wherein a first end of the first gate region and a first end of the second gate region do not extend outwardly in the first direction as far as the extended portion of the p-type diffusion region, and a second end of the first gate region and a second end of the second gate region do not extend outwardly in the second direction as far as the extended portion of the n-type diffusion region;
wherein the first conductive trace crosses the extended diffusion region of the p-type diffusion region of each of the basic cells in the row and the second condictive trace crosses the extended diffusion region of the n-type diffusion region in the row.

15. A basic cell for use in rows of an integrated circuit, comprising:

a diffusion region including a main diffusion region and an extended diffusion region, the diffusion region being a continuous area with the extended diffusion region extending outwardly from the main diffusion region in a first direction;
a gate structure with a gate region and a contact region, the gate region extending across the main diffusion region in the first direction, the gate region forming a transistor gate terminal with transistor source and drain terminals on opposite sides of the gate region, and the contact region extending outwardly from the gate region; and
wherein the extended diffusion region extends outwardly in the first direction past the end of the gate structure.

16. The basic cell of claim 15 wherein the gate structure comprises polysilicon.

17. The basic cell of claim 15 wherein the gate structure is a continuous region.

18. A digital system comprising:

a processing unit;
a memory connected to the processing unit;
an input/output device connected to the processing unit; and
an integrated circuit in at least one of the processing unit, the memory, and the input/output device, the integrated circuit comprising:
   a diffusion region including a main diffusion region and an extended diffusion region, the extended diffusion region extending out from the main diffusion region in a first direction;
   a gate region extending across the main diffusion region in the first direction, the gate region forming a transistor gate terminal with transistor source and drain terminals on opposite sides of the gate region; and
   an extended gate region at a first end of the gate region, wherein the extended diffusion region extends outwardly in the first direction past the extended gate region.

* * * * *